(12) United States Patent
Belady et al.

(10) Patent No.: US 7,072,185 B1
(45) Date of Patent: Jul. 4, 2006

(54) ELECTRONIC MODULE FOR SYSTEM BOARD WITH PASS-THRU HOLES

(75) Inventors: Christian L. Belady, McKinney, TX (US); Gary W. Williams, Rowlett, TX (US); Shaun L Harris, McKinney, TX (US); Steven A. Belson, Plano, TX (US); Eric C. Peterson, McKinney, TX (US); Stuart C. Haden, Lucas, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 11/021,527

(22) Filed: Dec. 21, 2004

(51) Int. Cl.
*H05K 7/20* (2006.01)
(52) U.S. Cl. ..................................... 361/704
(58) Field of Classification Search ................ 361/704, 361/707, 709–710, 715–722, 735, 744, 761, 361/763–764, 766, 782–785, 790–792
See application file for complete search history.

(56) References Cited

U.S. PATENT DOCUMENTS

| | | | |
|---|---|---|---|
| 6,490,161 B1 * | 12/2002 | Johnson | ............ 361/704 |
| 6,771,507 B1 | 8/2004 | Belady et al. | |
| 6,816,378 B1 | 11/2004 | Belady et al. | |
| 6,819,562 B1 | 11/2004 | Boudreaux et al. | |

OTHER PUBLICATIONS

David A. Klein, U.S. Appl. No. 10/800,837, filed Mar. 15, 2004, entitled "Multi-Processor Module".

* cited by examiner

*Primary Examiner*—Javaid H. Nasri

(57) ABSTRACT

Embodiments include apparatus, methods, and systems of an electronic module for a system board having at least one pass-thru hole. An exemplary electronic module, connectable to a system board with a pass-thru hole, includes a first portion coupled to one side of the system board. The first portion has a printed circuit board (PCB) with plural processors. A second portion of the electronic module couples to a second, opposite side of the system board. The second portion has a power system board electrically coupled to the first portion. The second portion also includes a thermal dissipation device that extends through the pass-thru hole of the system board.

13 Claims, 7 Drawing Sheets

ELECTRONIC MODULE FOR SYSTEM BOARD WITH PASS-THRU HOLES

BACKGROUND

Some electronic systems utilize several printed circuit boards with many different electronic components interconnected to the circuit boards. As these electronic systems decrease in size and increase in performance, packing density, heat dissipation, and power distribution architecture become increasingly important.

One way to increase packing density and reduce the actual size of an electronic device is to more closely position the electrical components together. Electrical components within a circuit board, however, are generally already tightly confined, and additional space may not be readily available. If, however, electrical components can be positioned to reduce the overall size of the electronic device, then significant savings and advantages can be realized.

As electrical components are more densely packed together and as performance of these components increases, heat dissipation can become a more significant factor in many electronic systems. Circuit boards may include a plurality of heat-generating devices that must be cooled in order to operate within a specified operating temperature. If these heat-generating devices are not sufficiently cooled, then the devices can exhibit a decrease in performance or even permanently fail. Further, if the heat-generating devices are closely packed together, then heat from one device could effect the performance of an adjacent device.

The design and layout of printed circuit board components can be quite complex and challenging. Designers must consider many factors, such as packing density and heat dissipation, to name a few examples. Improvements in these areas can realize significant benefits for electronic systems and devices.

SUMMARY

Embodiments include apparatus, methods, and systems of an electronic module for a system board having at least one pass-thru hole. An exemplary electronic module, connectable to a system board with a pass-thru hole, includes a first portion coupled to one side of the system board. The first portion has a printed circuit board (PCB) with plural processors. A second portion of the electronic module couples to a second, opposite side of the system board. The second portion has a power system board electrically coupled to the first portion. The second portion also includes a thermal dissipation device that extends through the pass-thru hole of the system board.

In another exemplary embodiment, a method comprises connecting a first portion of an electronic module to one side of a printed circuit board (PCB) having at least one pass-thru hole; and connecting a second portion of the electronic module to a second, opposite side of the PCB such that a thermal dissipation device disposed between the first and second portions extends through the at least one pass-thru hole.

Other embodiments and variations of these embodiments are shown and taught in the accompanying drawings and detailed description.

DETAILED DESCRIPTION

Figure 1:
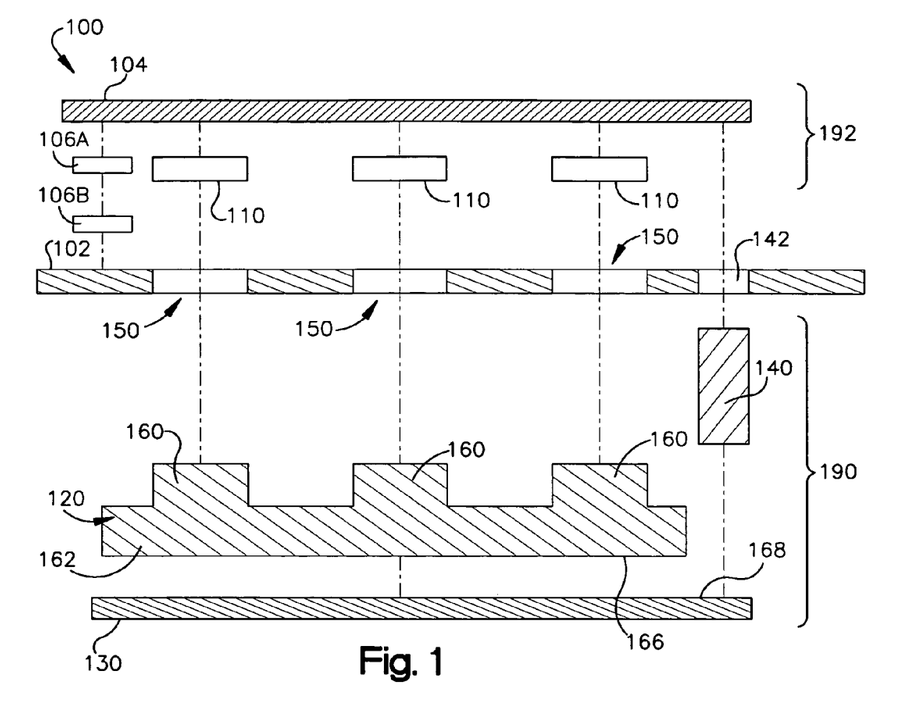
FIG. 1 is an exploded side view of a block diagram of an electronic assembly in accordance with an exemplary embodiment of the present invention.
Figure 2:
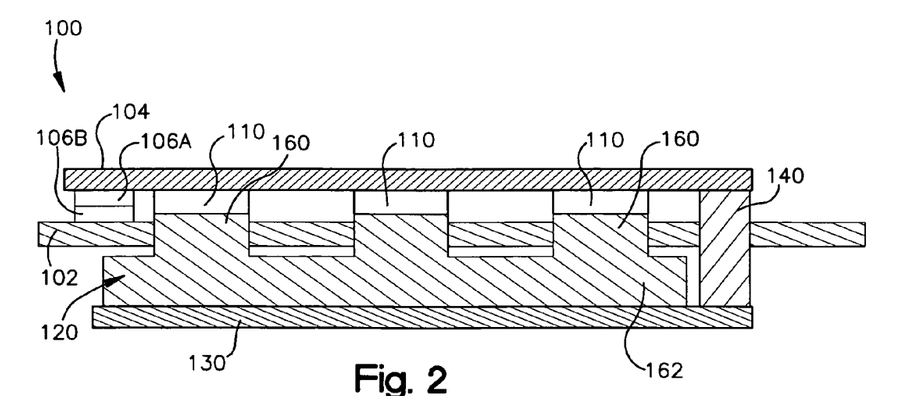
FIG. 2 is a side view of the electronic assembly of FIG. 1 with the electronic assembly being assembled together.
Figure 3:
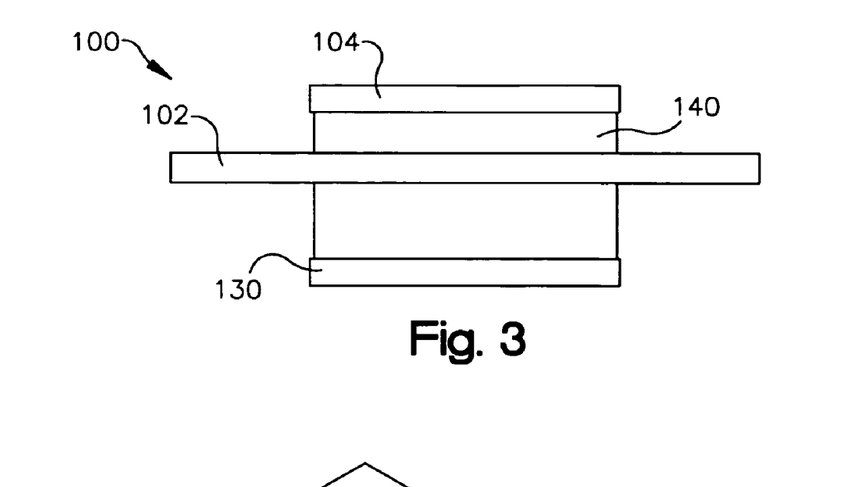
FIG. 3 is an end view of FIG. 2.

FIGS. 1–3 show an electronic system or assembly 100 in accordance with an exemplary embodiment of the present invention. The electronic assembly 100 includes two printed circuit boards (PCB) or printed wiring boards (PWB) 102 and 104. The PCBs 102 and 104 can have a variety of configurations and still be within embodiments in accordance with the invention. By way of example, the PCBs can include power module circuit boards, voltage regulation module (VRM) circuit boards, controller boards (such as a special type of expansion board that contains a controller for a peripheral device), expansion boards (such as any board that plugs into an expansion slot of a computer), or modules. As another example, the PCB 102 can be a motherboard, and the PCB 104 can be a daughterboard.

A motherboard is a printed circuit board that can be used in a personal computer, server, or other electronic device. The motherboard (also known as a main board or system board) can provide attachment points for processors, graphics cards, sound cards, controllers, memory, integrated circuits (ICs), modules, PCBs, and many other electronic components and devices in a computing system. The daughterboard can be utilized as an extension of the motherboard or other card or board. The daughterboard can have plugs, sockets, pins, connectors, or other attachments for the motherboard or other boards. Connectors 106A and 106B, for example, can be used to electrically couple the PCB 102 to the PCB 104. Connectors 106 provide a mechanical and electrical interface or connection between the PCBs and may include, for example, a removably connectable plug (male) and socket (female). Alternatively, a single connector can be used to connect the PCBs 102 and 104. Further, a connection mechanism between PCBs 102 and 104 can be located at various positions, such as, but not limited to, the sides and/or ends of the PCBs. Further yet, soldering can be used in place of or in conjunction with any connection.

The PCBs 102 and 104 include a plurality of electronic components or devices. For example, the PCB 104 includes a plurality of heat-generating components or devices 110. These heat-generating devices include any electronic component that generates heat during operation. For example, heat-generating devices include, but are not limited to, electronic power circuits, integrated circuits (ICs) or chips, digital memory chips, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range. An ASIC can comprise an integrated circuit or chip that has functionality customized for a particular purpose or application. The PCBs 102 and 104 and/or power system 130 can also include a plurality of electronic components or device that may or may not generate heat, that may generate low or insignificant amounts of heat, or that may generate heat but not require the generated heat to be thermally dissipated from the device for the device to operate properly or within a specified temperature range. Examples of such devices include, but are not limited to, resistors, capacitors, transistors, diodes, memories, etc.

The electronic assembly 100 includes at least one thermal solution or thermal dissipation device 120. Thermal dissipation devices include, but are not limited to, heat spreaders, cold plates or thermal-stiffener plates, refrigeration (evaporative cooling) plates, heat pipes, mechanical gap fillers (such as a plurality of rods, pins, etc.), thermal pads, or other devices adapted to dissipate heat. Further, thermal dissipation devices include thermal compounds and thermal interface material that can be used to form a thermally conductive layer on a substrate, between electronic components, or within a finished component. For example, thermally conductive resins, tapes, molded thermoplastic compounds, adhesives, gap pads, and greases can be used between a heat-generating device and thermal dissipating device to improve heat dissipation and/or heat transfer. Further, thermal dissipation devices include heatsinks. A heatsink is a component designed to reduce the temperature of a heat-generating device or component, such as heat-generating components 110. A heatsink, for example, can dissipate heat in a direct or indirect heat exchange with the electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the thermal dissipation device, including heatsinks, can use liquids or phase change material. For example, the thermal dissipation device can conduct heat from heat generating devices to a heatsink that is liquid or air cooled. Furthermore, liquid pipes or liquid loops can be used to evacuate or transfer heat from the thermal dissipation device or module to an external location that is remote from the thermal dissipation device or module.

The electronic assembly 100 also includes at least one power supply or power system 130. Electrical connectors or power coupling devices 140 connect the respective power system 130 to the PCB 104. FIGS. 1–3 show one connector 140 located at an end or corner of the PCB 104 and/or power system 130. Although one connector 140 is shown, embodiments in accordance with the invention are not limited to a particular number, type, or location of connectors. For example, multiple connectors can be used to couple the power system 130 to the PCB 104. Alternatively, the connectors can be located at various positions, such as, but not limited to, the sides, middle, and/or ends of the PCB 104 and/or power system 130. Further yet, such connectors can pass through a hole or opening 142 in the PCB 102 or pass around or adjacent the PCB 102 to establish a connection between the PCB 104 and power system 130.

The power system 130 can include numerous embodiments for providing power to electronic components (such as heat-generating components 110) and/or PCBs (such as the PCB 104) within the electronic assembly 100. For example, the power system can be a factorized power architecture (FPA) module, a power converter, such as a direct current (DC) converter or DC-DC converter, DC linear regulator, AC-DC converter, DC switching regulator, or DC charge pump.

The power system 130 can be configured as PCBs, power module assemblies, power circuit cards/boards, and/or power module PCBs. As shown in FIGS. 1–3, the power system 130 is disposed in a parallel and vertically stacked-up relationship with the thermal dissipation device 120 and PCBs 102 and 104.

The PCB 102 includes a plurality of pass-thru holes 150. Pass-thru holes are holes or openings that extend through something (example, the PCB 102). Each pass-thru hole 150 is adapted or shaped to receive a portion of the thermal dissipation device 120 such that the portion extends through the hole or opening.

As best shown in FIGS. 1 and 2, the thermal dissipation device 120 includes a plurality of extensions or protrusions 160 that extends outwardly from a body or base 162 of the thermal dissipation device 120. The extensions 160 are adapted and shaped to fit through corresponding pass-thru holes 150 of the PCB 102 and contact, abut, or come in close proximity with a top outer surface of heat-generating devices 110.

The power system 130 may be modular and replaceable. In some embodiments, the power system 130 is an independently-operable unit or module that can be constructed with standardized units or dimensions for flexibility and replaceability for use in the electronic assembly 100. Further, the power system 130 can be connected to or removed from the electronic assembly (example, the PCB 104) without connecting, removing, or replacing other components in the electronic assembly 100 (example, the heat-generating components 110). As such, the power system 130 can be serviced (example, replaced or repaired) independently of the PCB 102 or the PCB 104 and/or heat generating components 110. By way of illustration, suppose for example that power system 130 fails or otherwise needs replaced or upgraded. The power system 130 can be disconnected and removed from the PCB 104 without removing or replacing the heat-generating components 110 and/or the PCBs 102 and 104. Alternatively, the thermal dissipation device 120 could be simultaneously removed with the power system 130.

The PCB 104 may be modular and replaceable. In some embodiments, the PCB 104 is an independently-operable unit or module that can be constructed with standardized units or dimensions for flexibility and replaceability for use in the electronic assembly 100. Further, the PCB 104 can be connected to or removed from the electronic assembly (example, the PCB 102 and/or power system 130) without connecting, removing, or replacing other components in the electronic assembly 100 (example, the power system 130). As such, the PCB 104 can be serviced (example, replaced or repaired) independently of the PCB 102 or the power system 130 and/or thermal dissipation device 120. By way of illustration, suppose for example that the PCB 104 fails or otherwise needs replaced or upgraded. The PCB 104 can be disconnected and removed from the PCB 102 and/or power system 130 while the power system 130 and thermal dissipation device 120 remain connected to the PCB 102. Once the PCB 104 is removed, heat-generating components 110 could, for example, be repaired or replaced, and the PCB 104 then re-attached or re-connected to the PCB 102 and the power system 130.

Once connected, the PCB 102 is sandwiched between the PCB 104 and the power system 130. Further, the PCBs 102 and 104 and power system 130 are spaced apart, parallel, and mechanically and electrically connected to form a vertical stacked-up configuration. As shown in FIGS. 1–3, the electronic assembly 100 comprises at least three different vertically stacked layers, with each layer being separated from the other layers. A first or top layer includes the PCB 104; a second or middle layer includes the PCB 102; and a third or bottom layer includes the power system 130. The thermal dissipation device 120 is disposed between the second and third layers and can, in some embodiments, form part of the third layer.

In one exemplary embodiment, the thermal dissipation device 120 substantially fills a volume of space that extends above a top surface of the heat-generating components 110 and that extends underneath the power system 130 and above the PCB 102. As shown for example in FIGS. 1 and 2, a portion of the top side 166 of the thermal dissipation device 120 extends along all of or substantially all of the surface area (length×width) of an underside 168 of the power system 130.

Although FIGS. 1–3 illustrate the PCB 104, power system 130, and thermal dissipation device 120 as being one-piece, embodiments in accordance with the invention are not limited to being one-piece, integrally formed, or the like. The PCB 104, power system 130, and thermal dissipation device can be formed as separate, distinct units or pieces that, for example, couple together or that electrically and/or mechanically communicate with each other.

The thermal dissipation device 120 can directly or indirectly attach to or contact with various layers and/or electrical components (such as the power system 130, the heat-generating components 110, and/or PCBs 102 and 104). For example, the thermal dissipation device 120 can directly contact the power system 130 so as to directly transfer or dissipate heat away from the power system. For example, heat can transfer from the underside 168 of the power system 130 to the top side 166 of the thermal dissipation device 120. Further, the thermal dissipation device 120 can directly contact the heat-generating components 110 so as to directly transfer or dissipate heat away from the heat-generating components.

As best shown in FIGS. 1 and 2, thermal dissipation device 120 comprises a unitary or single member. Embodiments in accordance with the invention, though, can utilize a wide variety of types and number of thermal dissipation devices. For example, the thermal dissipation device 120 can comprise a plurality of individual, separate members. Some examples of various embodiments that can be utilized in conjunction with the electronic assembly 100 are shown in FIGS. 4A–4C.

Figure 4A:
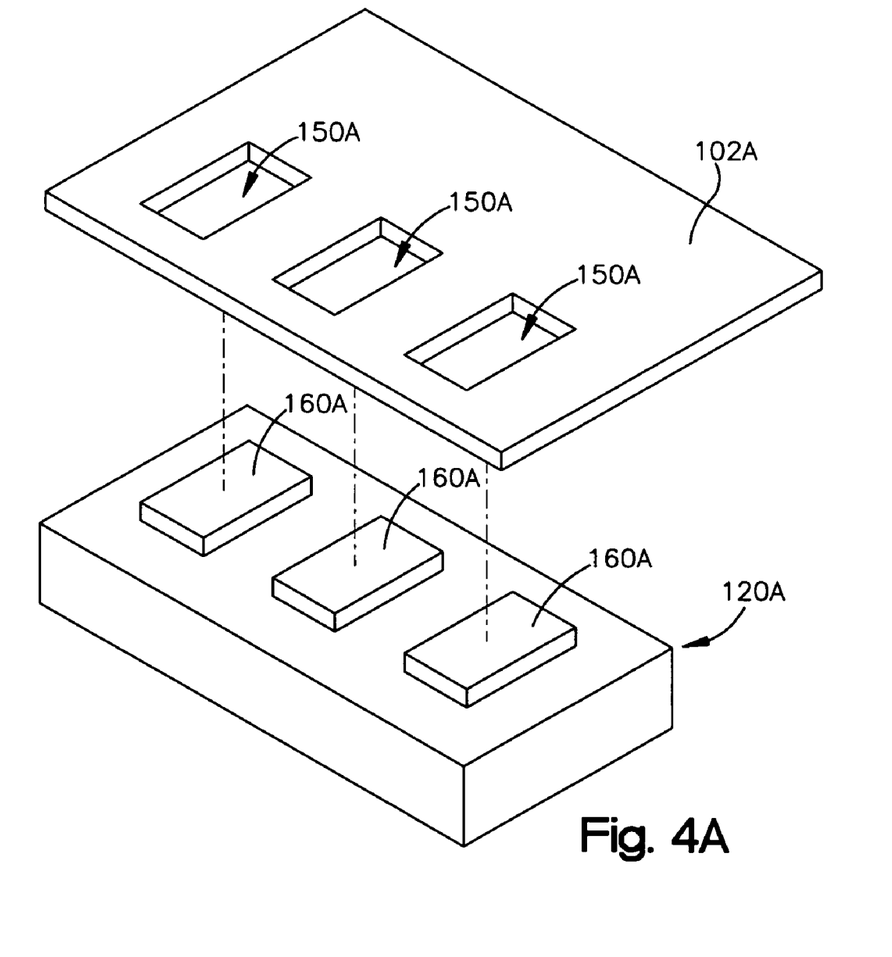
FIG. 4A is an exploded perspective view of a thermal dissipation device with a PCB having pass-thru holes.

FIG. 4A shows an exemplary embodiment of a PCB 102A and a thermal dissipation device 120A. The PCB 102A has plural (three shown) pass-thru holes 150A, and the thermal dissipation device has plural (three shown) extensions 160A. The pass-thru holes 150A are shaped and sized to receive the extensions 160A such that the extensions can pass through the PCB 102A to contact heat-generating components (shown in FIGS. 1–3). As shown, the number, size, and shape of the extensions 160A correspond to the number, size, and shape of pass-thru holes 150A. In one exemplary embodiment, one extension 160A and one corresponding pass-thru hole 150A can be provided for each heat-generating device (for example, each heat-generating device 110 on PCB 104 shown in FIGS. 1–3).

Figure 4B:
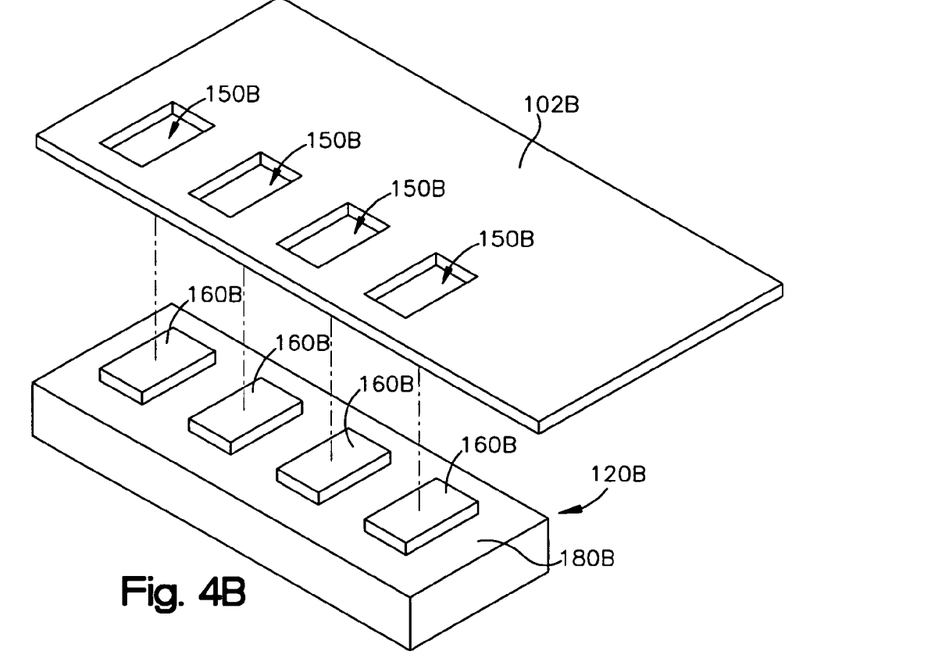
FIG. 4B is an exploded perspective view of another exemplary embodiment of a thermal dissipation device with a PCB having pass-thru holes.

FIG. 4B shows another exemplary embodiment of a PCB 102B and a thermal dissipation device 120B. The PCB 102B has plural (four shown) pass-thru holes 150B, and the thermal dissipation device 120B has plural (four shown) extensions 160B. The extensions 160B are separate and removable from a body portion 180B of the thermal dissipation device 120B. The pass-thru holes 150B are shaped and sized to receive the extensions 160B such that the extensions can pass through the PCB 102B to contact heat-generating components (shown in FIGS. 1–3). As shown, the number, size, and shape of the extensions 160B correspond to the number, size, and shape of pass-thru holes 150B. In one exemplary embodiment, one extension 160B and one corresponding pass-thru hole 150B can be provided for each heat-generating device (for example, each heat-generating device 110 on PCB 104 shown in FIGS. 1–3).

Figure 4C:
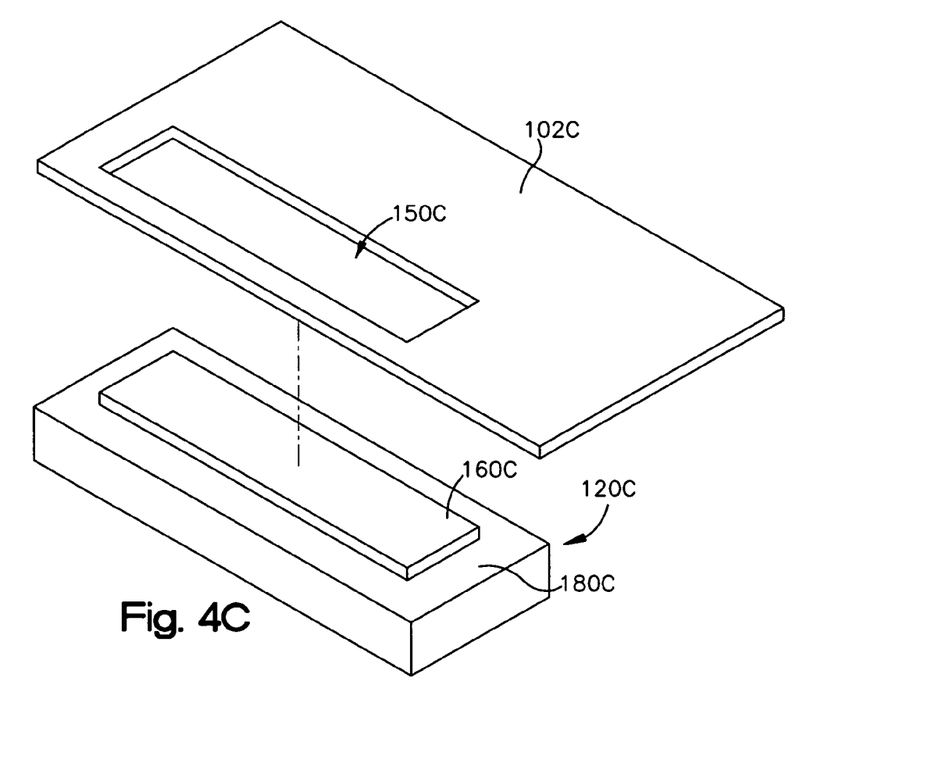
FIG. 4C is an exploded perspective view of yet another exemplary embodiment of a thermal dissipation device with a PCB having a pass-thru hole.

FIG. 4 C shows another exemplary embodiment of a PCB 102C and a thermal dissipation device 120C. The PCB 102C has a single pass-thru hole 150C, and the thermal dissipation device 120C has a single extension 160C. The extension 160C could be integral with a body portion 180C or separate and removable from the body portion 180C of the thermal dissipation device 120C. The pass-thru hole 150C is shaped and sized to receive the extension 160C such that the extension can pass through the PCB 102C to contact heat-generating components (shown in FIGS. 1–3). As shown, the number, size, and shape of the extension 160C correspond to the number, size, and shape of pass-thru holes 150C. In one exemplary embodiment, one extension 160C and one corresponding pass-thru hole 150C can be large enough to cover plural adjacent heat-generating devices (for example, plural heat-generating devices 110 on PCB 104 shown in FIGS. 1–3).

Embodiments in accordance with the present invention are not limited a specific location, number, size, or shape of pass-thru holes. For example, the pass-thru holes can be provided on a periphery or edge of a PCB or power system.

Figure 5:
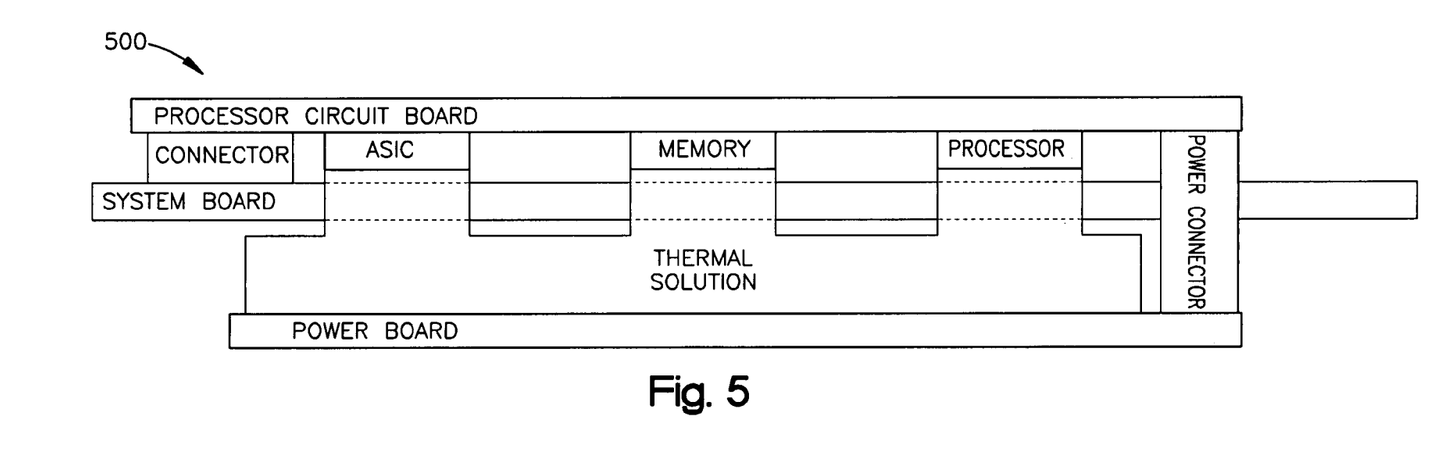
FIG. 5 is a side view of an exemplary embodiment of an electronic assembly being assembled together.
Figure 6:
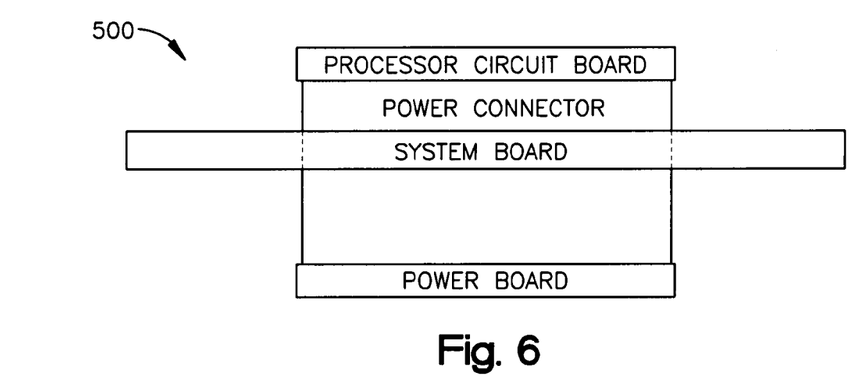
FIG. 6 is an end view of FIG. 5.

Various different electronic components, layers, and PCBs can be combined into different embodiments in accordance with the invention. FIGS. 5 and 6 illustrate one such exemplary embodiment as electronic assembly 500. In this figure, the processor circuit board can include (among other electrical components) processors, memories, and ASICs. For example, the processor circuit board can have numerous electronic heat-generating components, such as plural processors, an ASIC, and memory, to name a few examples. The processor circuit board is coupled, via a connector, to a system board. The system board is sandwiched between a power board and the processor circuit board in a vertical stacked-up configuration. A thermal solution is positioned between the power and system boards and directly above one surface of the power board to dissipate heat away from the power board. The thermal solution has a plurality of feet or extensions that extend through pass-thru holes in the system board. These feet contact the processors, ASIC, and memory to conduct and dissipate heat, via direct heat exchange, from the processors, ASIC, and memory. A power connector extends through a pass-thru in the system board to connect the power board to the processor circuit board. The power board can include power controls that can, for example, provide power control functionality for the power board.

Figure 7:
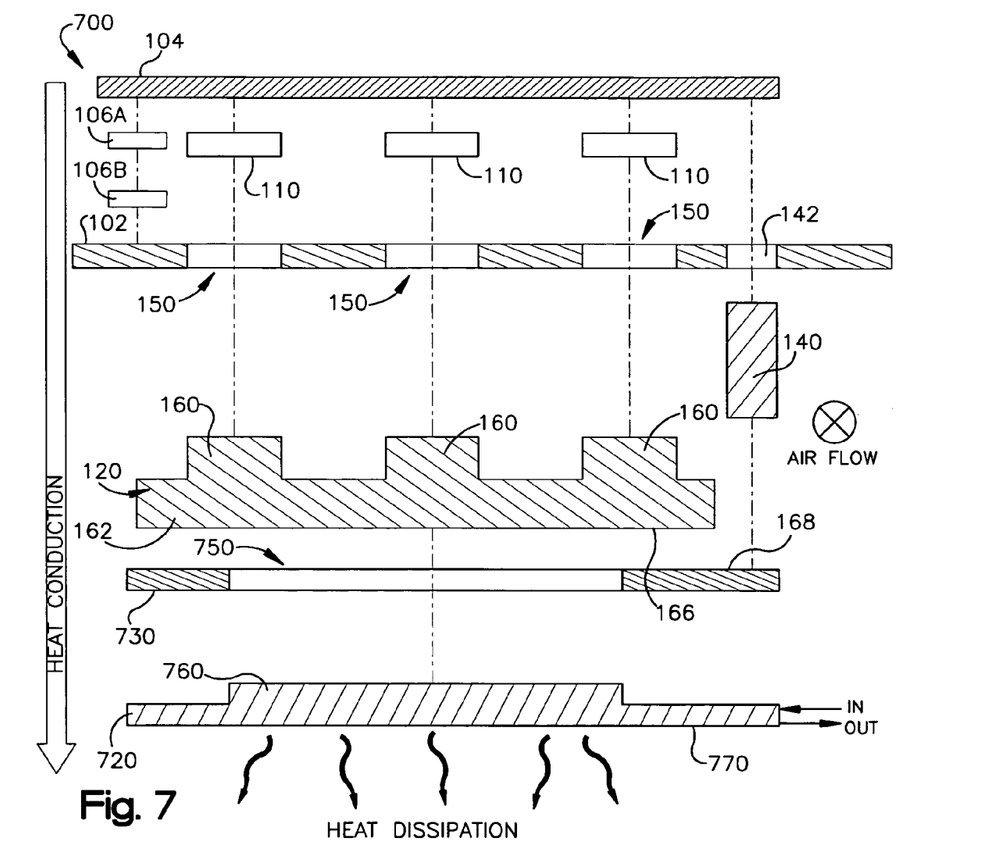
FIG. 7 is an exploded side view of a block diagram of an electronic assembly in accordance with another exemplary embodiment of the present invention.
Figure 8:
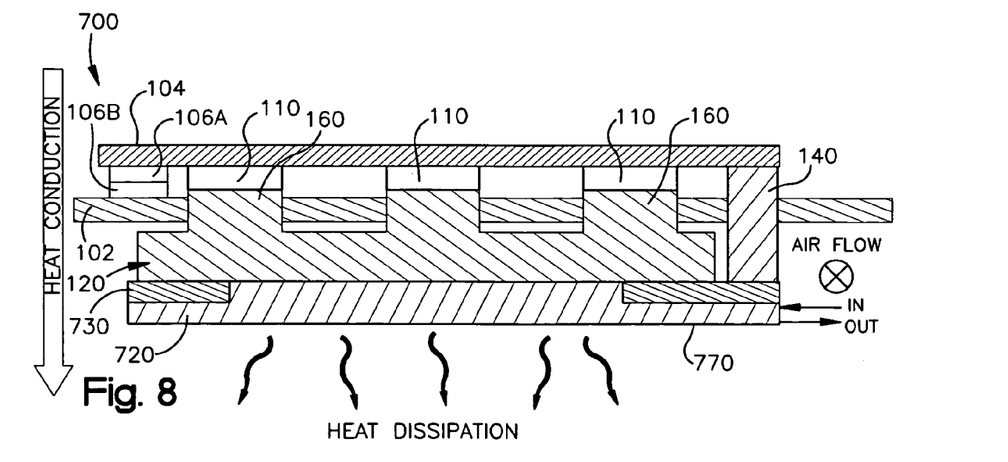
FIG. 8 is a side view of the electronic assembly of FIG. 7 with the electronic assembly being assembled together.

FIGS. 7 and 8 show another embodiment of an electronic assembly 700 wherein like reference numerals are used with common elements from FIGS. 1–3. Electronic assembly 700 includes a power system 730 disposed between a first thermal dissipation device 120 and a second thermal dissipation device 720. The power system 730 includes at least one pass-thru hole 750. Further, the second thermal dissipation device 720 includes at least one protrusion or extension 760 that is shaped and size to pass through the pass-thru hole 750 and contact the thermal dissipation device 120. Exemplary embodiments for pass-thru holes and extensions are discussed in connection with FIGS. 1–3 and 4A–4C.

Although FIGS. 7 and 8 illustrate two separate thermal dissipation devices 120, 720, embodiments in accordance with the invention are not limited to two separate devices. For example, the thermal dissipation devices 120, 720 could be combined into one single thermal dissipation device. As an illustration, the thermal dissipation device 120 could extend through the pass-thru hole 750 of the power system 730. As another example, the thermal dissipation devices 120, 720 could be formed from numerous separate components.

Heat can be conducted, exchanged, and dissipated through plural layers, devices, components, and/or modules in a variety of embodiments in accordance with the invention. For illustrations purposes, some of these exemplary embodiments are discussed in connection with FIGS. 7 and 8.

As one example, heat can be evacuated or dissipated for a module or layer from a common exit location or common surface area. As shown in FIGS. 7 and 8, heat generated by the heat-generating components 110 can be vertically conducted or transferred through the pass-thru holes 150 of both the PCB 102 and pass-thru hole 750 of the power system 730 and thereafter dissipated into the air or environment at a top surface of the electronic assembly. For instance, as heat is generated from heat-generating components 110, the generated heat is transferred from a top surface of the heat-generating components 110 to extensions 160 of thermal dissipation device 120. This heat travels through the extensions 160, into the body 162, through extension 760, and exits a surface 770 of thermal dissipation device 720. In this manner, heat is transferred from one end or side of the electronic assembly 100 to another end or side of the electronic assembly.

The surface 770 of the thermal dissipation device 720 can be enhanced to facilitate heat dissipate and/or heat exchange. For example, the surface 770 can include fins, rods, pins, or other features. Further yet, the surface of any thermal dissipation device can be formed as a separate body or unit that mounts to the body of the thermal dissipation device.

Although FIGS. 7 and 8 illustrate heat conduction or direct heat exchange to dissipate heat (example, heat being transferred from the heat-generating components 110, vertically through the PCB 102 and power system 730 and through the two thermal dissipation devices 120, 720 and exiting through a surface of the thermal dissipation device 720), heat can be dissipated in other ways as well. For example, one or both of the thermal dissipation devices 120, 720 can be an active device that produces an airflow. For purposes of illustration only, the electronic assembly 700 is shown with an airflow direction as indicated with arrows (the airflow being into the page and indicated with a circle and "X"). The airflow can be provided, for example, with a fan or other device positioned within the electronic assembly 700 or within or proximate the thermal dissipation devices 120, 720. For example, the airflow can be generated from a system fan. The airflow is directed in a pathway that is parallel to the PCBs 102 and 104 and power system 730. Airflow, however, is not limited to any particular direction. In some embodiments, for example, the airflow can be directed in a perpendicular direction with respect to the PCB 102, PCB 104, power system 130, and/or heat-generating components 110. A primary airflow can thus be directed at, above, or below the PCBs 102 and 104, the heat-generating components 110, the power system 730, and/or the thermal dissipation devices 120, 720. Further, the primary airflow can be simultaneously directed to several different components/layers (such as the PCBs 102 and 104, the heat-generating components 110, the power system 730, and/or the thermal dissipation devices 120, 720) or exclusively at individual components/layers. Thus, the same airflow can be used to cool or dissipate heat simultaneously from multiple layers and/or components or solely from a single layer and/or component.

The airflow can be utilized to assist or augment heat transfer or dissipation. In this regard, the electronic assembly 700 can utilize one or both of heat conduction and/or an airflow pathway to dissipate heat. The combinations of heat conduction and airflow to dissipate heat are numerous. By way of illustration, the thermal dissipation device 120 can directly contact the heat-generating components 110 to conduct heat away from these components. At the same time, either or both thermal dissipation devices 120, 720 could generate or be exposed to an airflow that is directed at both the PCBs 102, 104 and the thermal dissipation devices. For example, this airflow could be utilized to cool the PCB 104 (including heat-generating components) and the thermal dissipation device 120 as the thermal dissipation device conducts and dissipates heat away from the heat-generating components 110. Thus, the same thermal dissipation device simultaneously dissipates heat away from PCBs 102 and 104, heat-generating components 110, and power system 730.

Thermal dissipation devices can utilize a remote heat exchanger (RHE). An RHE enables the thermal dissipation device to be remote from the heat-generating device (such as PCB 104, heat-generating components 110, and/or power system 730). For example, heat can be transferred from the heat-generating device to an attachment block having a heat pipe. Further, the heat pipe can be integral to the module or any portion of the electronic system (example, the thermal dissipation device) and extend outwardly from the electronic system to a remote heatsink. Alternatively, the heat pipe can attach to a surface of the module or system (example a surface of a thermal dissipation device) and then extend to a remote heatsink. The heat pipe, for instance, can be a hollow copper pipe containing a fluid and wicking material. Through a process of vaporization and re-condensation, heat travels through the heat pipe to a heat exchanger, such as a finned heat sink. Localized airflow can be used to evacuate the heat to the environment.

Looking to FIGS. 7 and 8 as examples, the thermal dissipation device 720 could be a cold-plate and/or utilize heat dissipation via heat pipes or liquids. The "In" and "Out" arrows signify liquid-in and liquid-out, respectively. As such, the thermal dissipation device 720 can be coupled to a pump and/or a heat exchanger to circulate a cooling liquid through the thermal solution to cool any one or combination of PCBs, heat-generating components, power system, etc.

The thermal dissipation device 720 can be utilized in conjunction with one or both of the heat conduction and/or airflow cooling techniques discussed herein. As one example, the thermal dissipation device 120 of FIGS. 1–3 can include a separate piece or unit on the top surface 166 (such as the thermal dissipation device 720 discussed in connection with FIGS. 7 and 8). This separate piece could be a liquid cold plate, evaporator, refrigerator, heatsink, or other device or technology known in the art.

As discussed herein, the thermal dissipation device can comprise numerous different embodiments in accordance with the invention. FIGS. 9A to 9D illustrate further examples of thermal dissipation devices that can be utilized in conjunction with the electronic assembly. These examples illustrate a single airflow, but multiple airflows with various directions are within embodiments in accordance with the invention.

Figure 9A:
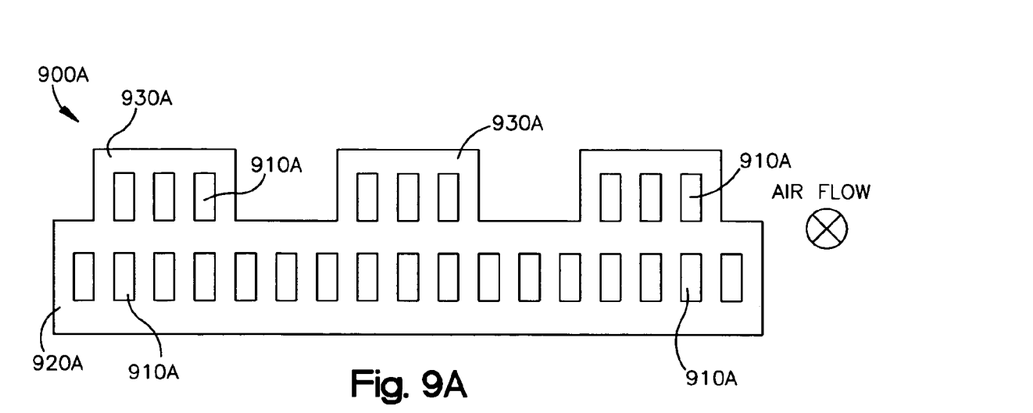
FIG. 9A is an exemplary embodiment of a thermal dissipation device.

FIG. 9A shows a thermal dissipation device 900A having a plurality of openings 910A. The openings 910A extend through both a base portion 920A and plural extensions 930A. Further, the openings 910A can have a variety of configurations and/or shapes and include slots, holes, etc. and can be formed from adjacent pins, rods, fins, etc. The openings 910A enable an airflow (the airflow being into the page and indicated with a circle and "X") to pass through the thermal dissipation device 900A.

Figure 9B:
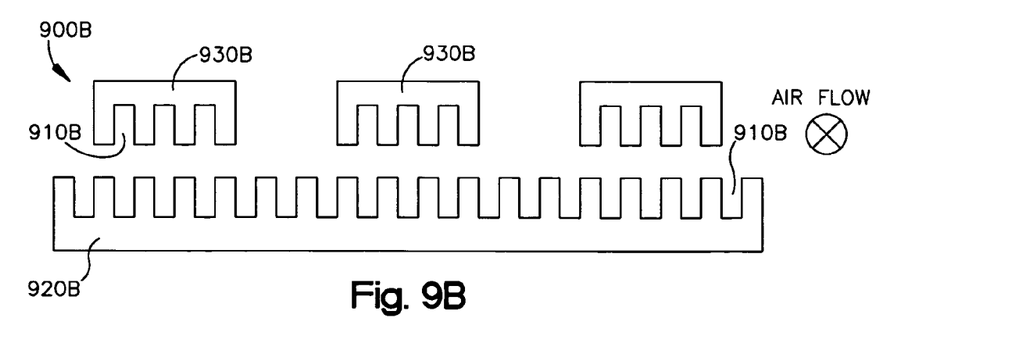
FIG. 9B is another exemplary embodiment of a thermal dissipation device.

FIG. 9B shows another example of a thermal dissipation device 900B having a plurality of openings 910B. The openings extend through both a base portion 920B and plural extensions 930B. As shown, the extensions 930B are separate and removable from the base portion 920B. Further, the openings 910B can have a variety of configurations and/or shapes and include slots, holes, etc. and can be formed from adjacent pins, rods, fins, etc. The openings 910B enable an airflow (the airflow being into the page and indicated with a circle and "X") to pass through the thermal dissipation device 900B.

Figure 9C:
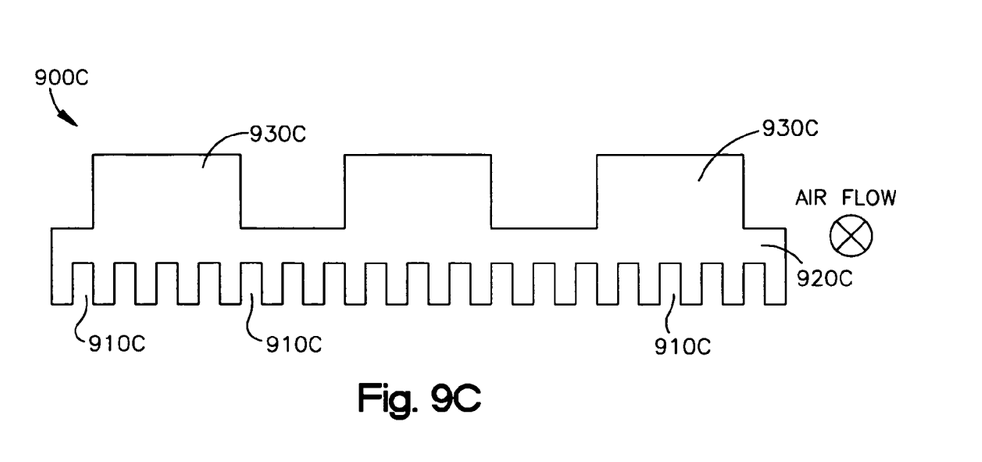
FIG. 9C is another exemplary embodiment of a thermal dissipation device.

FIG. 9C shows another example of a thermal dissipation device 900C having a plurality of openings 910C. Extensions 930C extend upwardly from a base portion 920C. Further, the openings 910C can have a variety of configurations and/or shapes and include slots, holes, etc. and can be formed from adjacent pins, rods, fins, etc. The openings 910C enable an airflow (the airflow being into the page and indicated with a circle and "X") to pass through the thermal dissipation device 900C.

Figure 9D:
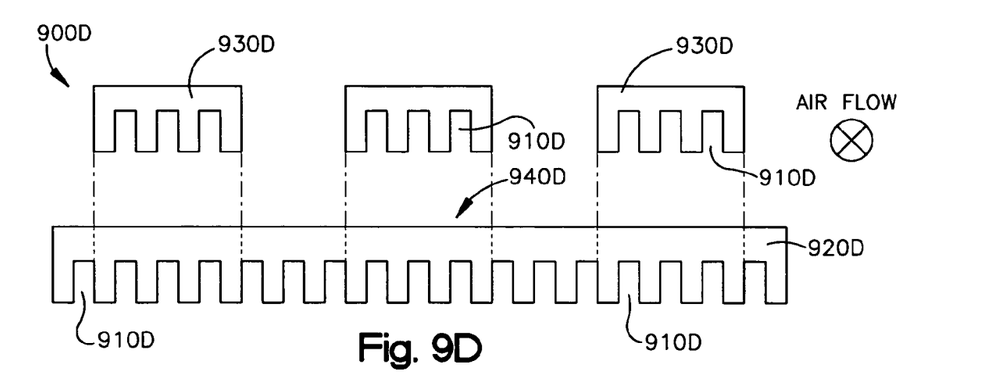
FIG. 9D is another exemplary embodiment of a thermal dissipation device.

FIG. 9D shows another example of a thermal dissipation device 900D having a plurality of openings 910D. Extensions 930D are separate and removable from a base portion 920D. These extensions 930D extend through holes or openings 940D in the base portion 920D. The openings 910D can have a variety of configurations and/or shapes and include slots, holes, etc. and can be formed from adjacent pins, rods, fins, etc. The openings 910D enable an airflow (the airflow being into the page and indicated with a circle and "X") to pass through the thermal dissipation device 900D.

Embodiments in accordance with the present invention can utilize a modular connective architecture. If a particular electronic component (including PCBs) or device fails or otherwise needs to be replaced, the electronic component can be removed from the module or the electronic assembly and replaced with a new and/or different component. As such, the electronic assemblies can be constructed with standardized electronic components and/or dimensions to enable flexibility and variety of use and exchange of components. Looking to FIGS. 5 and 6 as an example, if the thermal solution fails or needs to be replaced, the thermal solution and power board can be disconnected and/or removed from the electronic assembly. Thereafter, a new and/or different thermal solution can be connected to the electronic assembly and the power board attached to the thermal solution. As another example, if the power board fails or needs to be replaced, the power board can be disconnected or uncoupled from the power connector and removed from the electronic assembly while the processor circuit board and system board remain mechanically connected. The thermal solution can be removed with the power board or remain connected to the electronic assembly. A new and/or different power circuit board can thereafter be connected to the power connector and utilized with the electronic assembly. As such, expensive heat-generating components (such as processors, memories, ASICs, etc.) can remain unchanged and do not need to be removed or replaced when the power board and/or thermal solution are removed or replaced.

As used herein, the term "module" means a unit, package, or functional assembly of electronic components for use with other electronic assemblies or electronic components. A module may be an independently-operable unit that is part of a total or larger electronic structure or device. Further, the module may be independently connectable and independently removable from the total or larger electronic structure.

The configuration or arrangement of electronic components, layers, and/or modules shown in the figures saves weight, space, and costs since the components and/or layers are efficiently spaced and additional thermal dissipation devices are not required. For example, embodiments in accordance with the present invention can utilize a variety of modules. Looking to FIGS. 1–3, the PCB 104 can be a processor module that includes heat-generating components 110 (such as plural separate processors, an ASIC, and memory all on the same board or card). As another example, the power system 130 can form a power system module that may or may not include the thermal dissipation device 120. The power system module can vertically stack and connect or coupled, via connector 140, to the PCB 104. The thermal dissipation device 120 can be disposed on one surface of the power system 130. Together, the power system module, connector, processor module, and thermal dissipation device form a processor/power module that can be removably connected to, for example, the PCB 102. FIGS. 1–3, for example, show such a processor/power module connected, via connectors 106A and 106B, to PCB 102. Further, the power system 130 can provide a power source that is proximally close to the load (example the PCB 104) in order to minimize noise and optimize step load performance.

In one exemplary embodiment, the processor/power module can comprise two halves that mechanically and electrically connect or couple together. A first half includes the power system module, shown for example as 190 in FIG. 1. The power system module can include the power system 130 with or without the thermal dissipation device 120. A second half includes the processor module, shown for example as 192 in FIG. 1. The processor module includes the heat-generating components 110. In order to assemble the processor/power module, the first half (i.e., the power system module) is coupled or connected to a first side of the PCB 102. A second half (i.e., the processor module) is coupled or connected to a second side (opposite the first side) of the PCB 102. Various connectors can be used to couple the first and second halves to the PCB 102. As best shown in FIGS. 1–3, the PCB 102 is sandwiched between the processor/ power module. Further, as shown, when the processor/power module is assembled, the heat-generating components 110 are positioned inside a housing of the processor/power module itself. This configuration increases packing density of the module. Further, as noted herein, pass-thru holes in the PCB 102 enable heat to transfer from the first half to the second half. Further, these pass-thru holes can enable the first and second halves to mechanically and electrically coupled or connect together.

The processor/power module can have various configurations. For illustration purposes (as shown in FIGS. 1–3), the processor/power module has a general rectangular configuration. A top surface is formed from one outer surface of the PCB 104, and a bottom surface is formed from one outer surface of the power system 130. The connector 140 forms one end of the module, while connectors 106A, 106B and an end portion of the thermal dissipation device 120 forms another end of the module.

The processor/power module is also adaptable to have various components and layers arranged inside the module. For example, the processor module could include a thermal dissipation device. In this embodiment, the processor thermal dissipation device would be disposed between the PCB 102 and the PCB 104. Further, this processor thermal dissipation device could extend through one or more pass-thru holes in the PCB 102. A second thermal dissipation device could be disposed between the PCB 102 and the power system 130. The processor thermal dissipation device and the second thermal dissipation device could exchange of conduct heat between the devices. Alternatively, the processor thermal dissipation device could also extend or be disposed between the PCB 102 and power system 130. In yet another embodiment, the processor thermal dissipation device could extend through a pass-thru hole in the power system. One skilled in the art will appreciate that various other embodiments exist to arrange the components and layers within the module.

In order to facilitate modularity within the electronic assembly, various removable connections between electronic components can be utilized. By way of example, such connections include, but are not limited to, land grid arrays (LGAs), pin grid arrays (PGAs), plugs (example, male), sockets (example, female), pins, connectors, soldering, or other removable or disconnectable attachments.

A module can include a variety of different heat exchanging or heat transferring interfaces (such as the interface between two thermal dissipation devices or the interface between a thermal dissipation and a PCB or a heat-generating component). These interfaces can be adapted to enhance heat conduction or heat exchange. For example, the interfaces can include conductive resins, tapes, adhesives, gap pads, greases, or any other device or compound that facilitates or improves heat conduction.

Embodiments in accordance with the invention can be utilized in a wide variety of different methods and embodiments. For example, embodiments in accordance with the present invention can utilize embodiments taught in U.S. patent application Ser. No. 10/800,837 filed Mar. 15, 2004, entitled "Multi-Processor Module" and incorporated herein by reference. As another example, an exemplary method can comprise connecting plural heat-generating components to a first circuit board. The heat-generating components can include plural separate processors (example processors formed on separate dies), ASICs, memories, and other devices. A power system can be connected in a vertical stacked-up configuration to the first circuit board. One or more power connectors can couple the power system to the first circuit board. A thermal dissipation device is disposed above or along one surface of the power system and between the power system and first circuit board. The thermal dissipation device thermally dissipates heat away from both the first circuit board (including the heat-generating components) and the power system. The thermal dissipation device can simultaneously dissipate heat (for example via a direct heat exchange) from both the first circuit board (including the heat-generating components) and the power system. Additionally, the thermal dissipation device can comprise, utilize, or generate a liquid exchange flow or a flow of air in an airflow pathway. The airflow pathway can be directed to any one of or any combination of the first circuit board, the power system, the thermal dissipation device, and/or the heat-generating components. Further, a liquid flow can be utilized to remove, dissipate, or transfer heat away from PCBs, the power system, or heat-generating components. Together, the power system, first circuit board, thermal dissipation device, and heat-generating components form a processor/power module. This module can be connected to a second circuit board (such as a system board or motherboard) and arranged, for example, in a vertically stacked-up configuration. For example, a first half of the processor/power module can connect or couple to one side of the second circuit board, and a second half of the processor/power module can connect or couple to a second side (opposite the first side) of the second circuit board. The second circuit board includes one or more pass-thru holes for receiving portions of the first and/or second halves. The processor/power module is removably connectable to the second circuit board. The pass-thru holes also enable heat to transfer through the second circuit board and from one half to the other half of the module. The components with in the processor/power module (such as the thermal dissipation device, the PCB, the processors, the memory, the ASIC, and/or the power system) can be individually or jointly repaired or replaced. The revised power/processor module can then be re-connected to the second circuit board.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. An electronic module connectable to a system board with pass-thru holes, the electronic module comprising:
   a first portion coupled to one side of the system board and having a printed circuit board (PCB) with plural processors; and
   a second portion coupled to a second, opposite side of the system board, having a power system board electrically coupled to the first portion, and having thermal dissipation device,
   wherein the thermal dissipation device extends through at least one of the pass-thru holes.

2. The electronic module of claim 1 wherein the PCB forms one side of the electronic module, and the power system board forms a second side of the electronic module.

3. The electric module of claim 1 wherein each processor is aligned with one of the pass-thru holes to receive a portion of the thermal dissipation device that extends through the pass-thru hole.

4. The electronic module of claim 1 wherein the thermal dissipation device directly contacts the plural processors and the power system for dissipation heat directly away from the plural processors and the power system.

5. The electronic module of claim 1 wherein the thermal dissipation device has plural extensions a extend through plural pass-thru holes of the system board.

6. The electronic module of claim 5 wherein the extensions conduct heat away from the plural processors.

7. The electronic module of claim 1 wherein heat generated by the processors is conducted, via the thermal dissipation device, from the first portion to the second module.

8. The electronic module of claim 1 wherein heat generated by the processors is conducted through the at least one pass-thru hole and exited from the electronic module.

9. The electronic module of claim 1 wherein the thermal dissipation device substantially fills a volume of space formed between the PCB and the power system board.

10. An electronic module connectable to a system board with a pass-thru hole, the electronic module, comprising:
   a circuit board having plural separate processors;
   a power board coupled, to form a vertically stacked-up configuration, to the circuit board for providing power to the circuit board; and
   a thermal dissipation device disposed between the circuit and power boards for dissipating heat away from the processors, wherein the electronic module extends through the pass-thru hole and connects on two opposite sides of the system board.

11. The electronic module of claim 10 wherein the thermal dissipation device extends trough the pass-thru hole to conduct heat away from the processors.

12. The electronic module of claim 10 wherein:
   the electronic module has a rectangular configuration;
   the pass-thru holes extends above two processors;
   the thermal dissipation device dissipates heat, via a direct heat exchange, away from both the power board and the two processors.

13. The electronic module of claim 10 wherein the circuit board forms one side of the electronic module, the power board forms another side of the electronic module, and the system board passes through the electronic module between the circuit and power boards.

* * * * *

UNITED STATES PATENT AND TRADEMARK OFFICE
CERTIFICATE OF CORRECTION

PATENT NO. : 7,072,185 B1   Page 1 of 1
APPLICATION NO. : 11/021527
DATED : July 4, 2006
INVENTOR(S) : Christian L. Belady et al.

It is certified that error appears in the above-identified patent and that said Letters Patent is hereby corrected as shown below:

In column 12, line 60, in Claim 3, delete "electric" and insert -- electronic --, therefor.

In column 12, line 66, in Claim 4, delete "dissipation" and insert -- dissipating --, therefor.

In column 13, line 2, in Claim 5, after "extensions" delete "a" and insert -- that --, therefor.

In column 13, line 8, in Claim 7, delete "module" and insert -- portion --, therefor.

In column 14, line 6, in Claim 11, delete "trough" and insert -- through --, therefor.

Signed and Sealed this

Third Day of March, 2009

JOHN DOLL
*Acting Director of the United States Patent and Trademark Office*